(12) United States Patent
Kitsukawa et al.

(10) Patent No.: US 6,717,833 B2
(45) Date of Patent: Apr. 6, 2004

(54) SEMICONDUCTOR DEVICE

(75) Inventors: Goro Kitsukawa, Hinode-machi (JP); Yoji Idei, Asaka (JP); Kanji Oishi, Koganei (JP); Akira Ide, Musashino (JP)

(73) Assignee: Hitachi, Ltd., Tokyo (JP)

( * ) Notice: Subject to any disclaimer, the term of this patent is extended or adjusted under 35 U.S.C. 154(b) by 395 days.

(21) Appl. No.: 09/750,625

(22) Filed: Dec. 12, 2000

(65) Prior Publication Data

US 2001/0000687 A1 May 3, 2001

Related U.S. Application Data

(63) Continuation of application No. 09/357,369, filed on Jul. 20, 1999, now Pat. No. 6,175,516.

(30) Foreign Application Priority Data

Jul. 28, 1998 (JP) .......................................... 10-212301

(51) Int. Cl.$^7$ ............................................... G11C 5/06
(52) U.S. Cl. ........................................ 365/63; 365/196
(58) Field of Search .................................... 365/63, 196

(56) References Cited

U.S. PATENT DOCUMENTS 5,257,224 A * 10/1993 Nojiri et al. ................. 365/175
5,568,427 A   10/1996 Takemae ............... 365/189.02

* cited by examiner

Primary Examiner—M. Tran
(74) Attorney, Agent, or Firm—Antonelli, Terry, Stout & Kraus, LLP

(57) ABSTRACT

A 64Mb DRAM includes memory cell array areas 15, sense amplifier areas 16, subword driver areas 17, and cross areas 18. For each horizontal input/output line IOH paraleel to the word line W, throuh holes on the sense amplifiers provide connections between the second metal line hierarchy M2 and the third metal line hierarchy M3. The vertical input/output line IOV parallel to the bit line BL runs through a plurality of memory cell array areas 15 in a direction parallel to the column selection signal line YS and connects to the main amplifier MA outside the memory cell array areas 15. In this input/output line configuration, the greater the number of word lines W that are selected, the greater the number of bits that can be output.

17 Claims, 20 Drawing Sheets

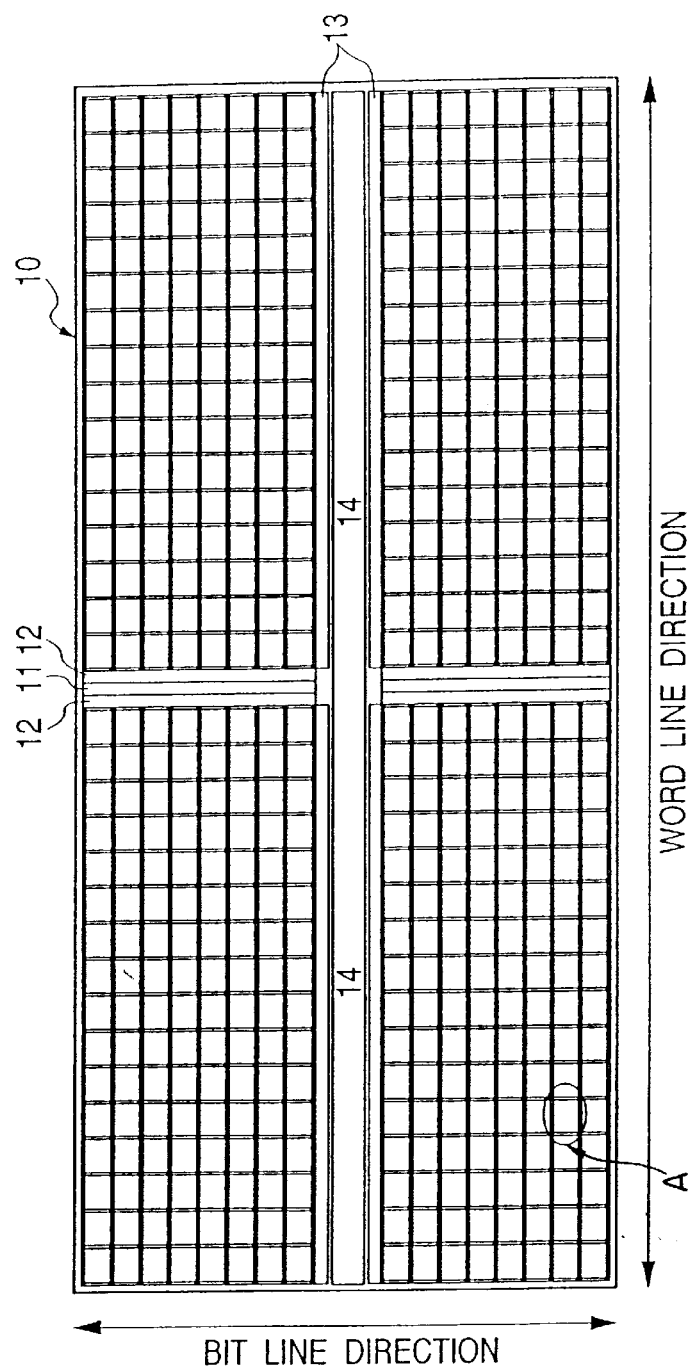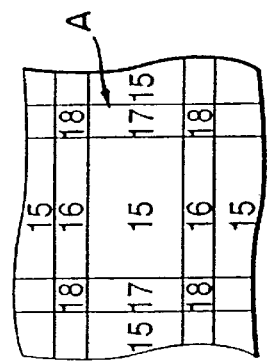
FIG. 1a
FIG. 1b

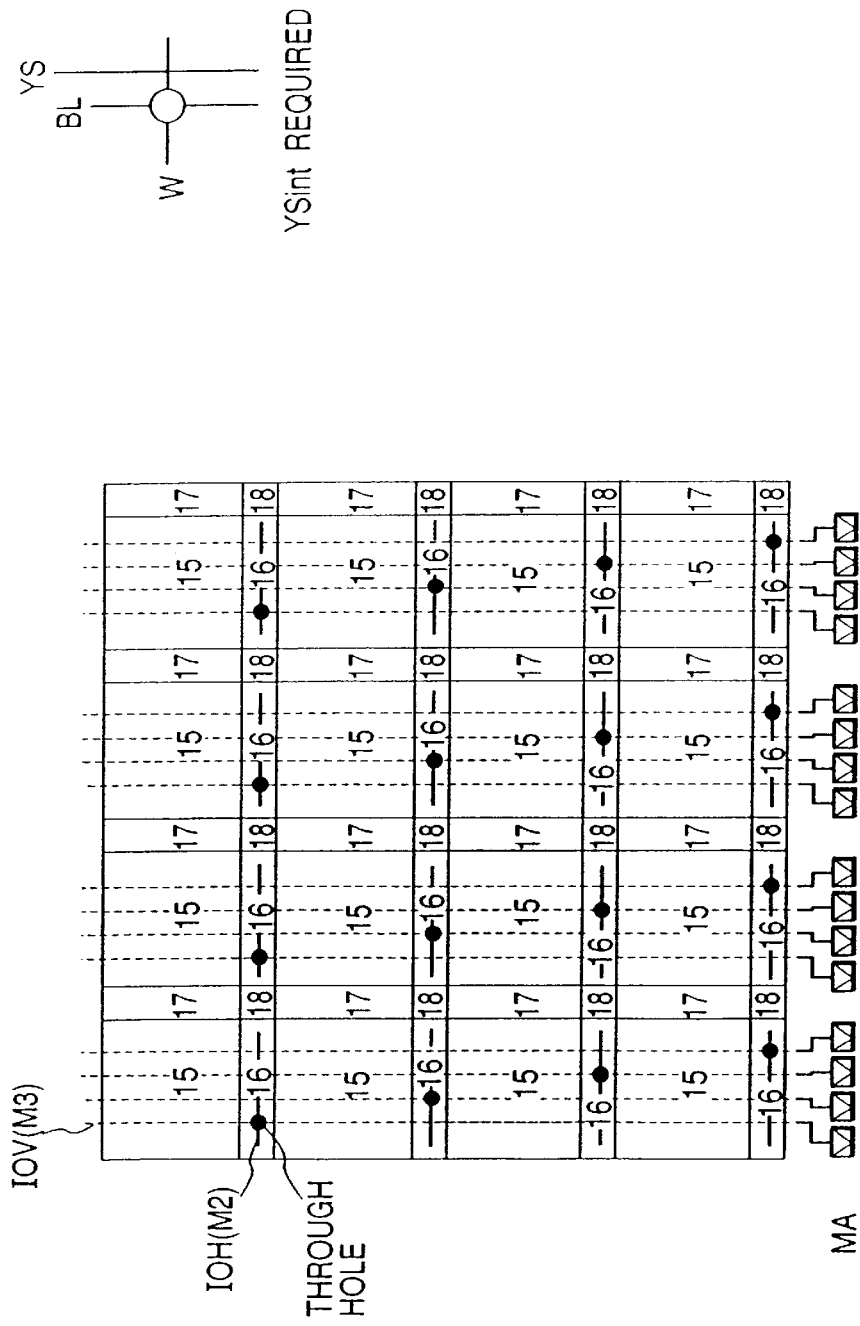

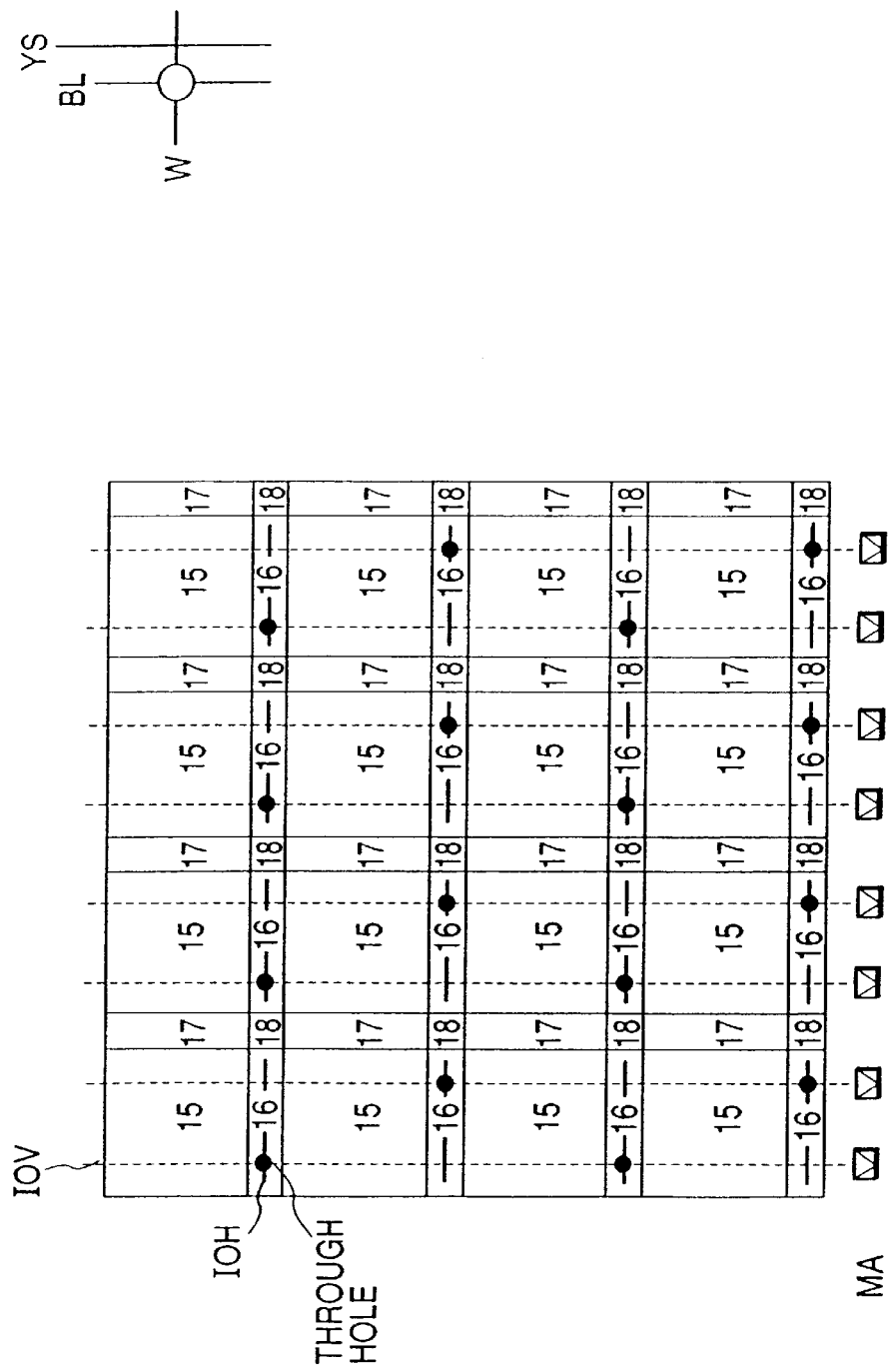

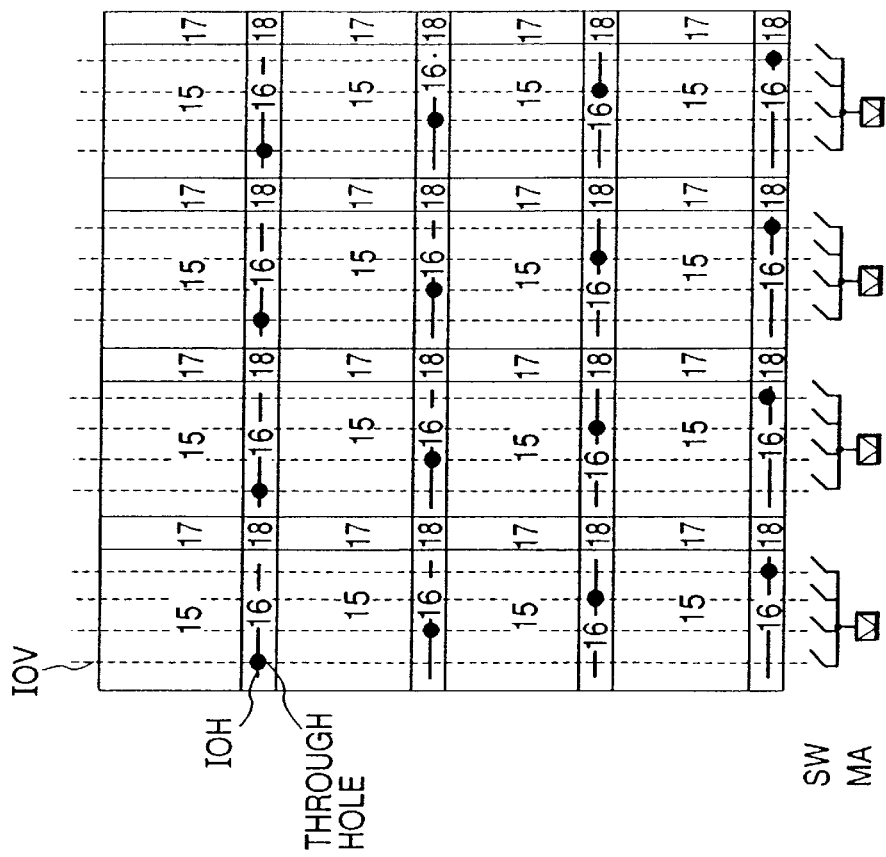

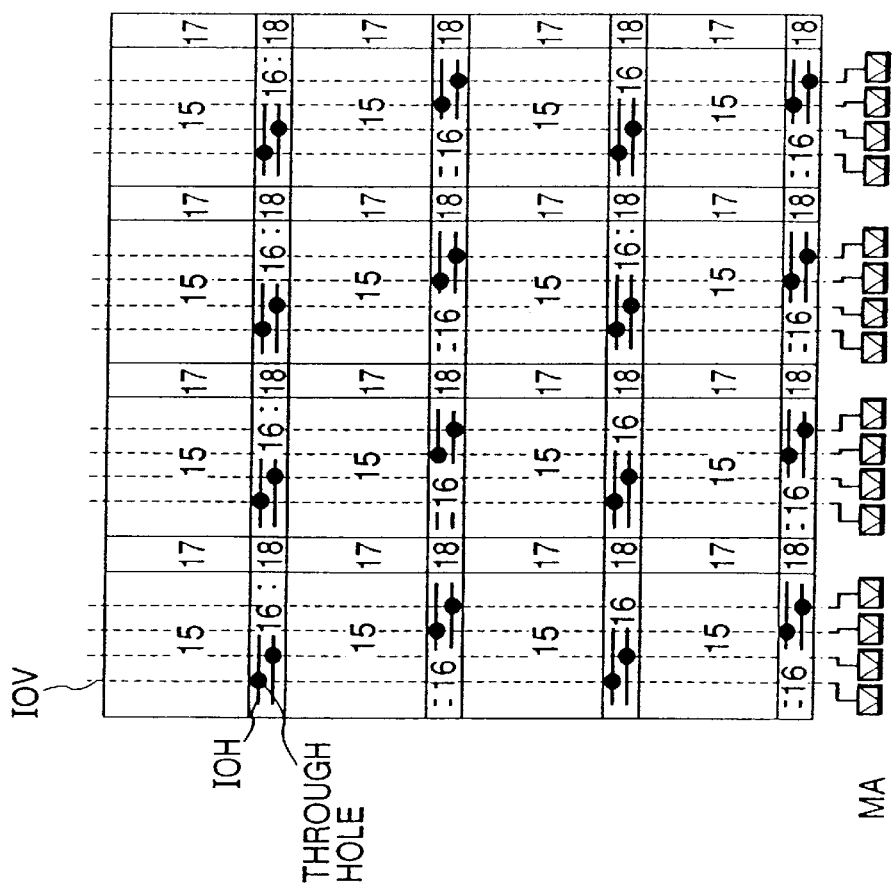

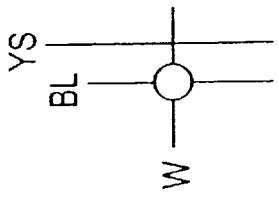
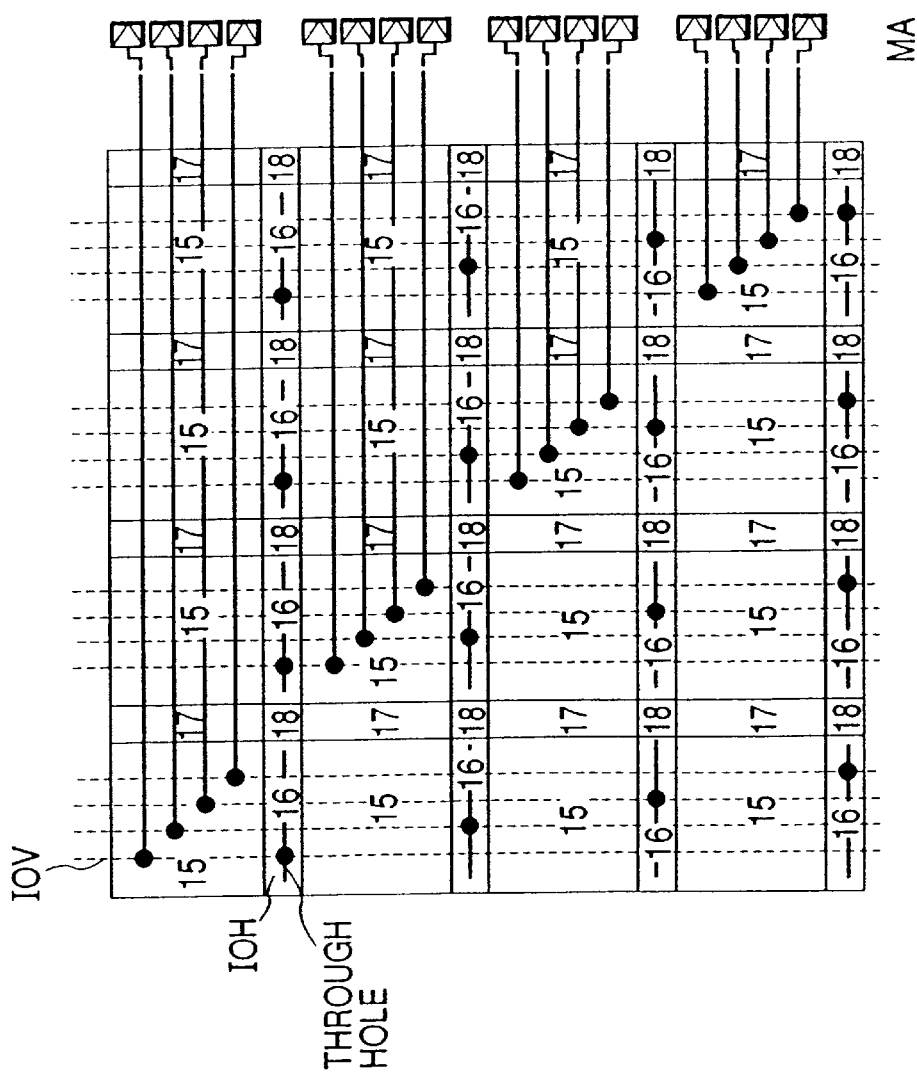

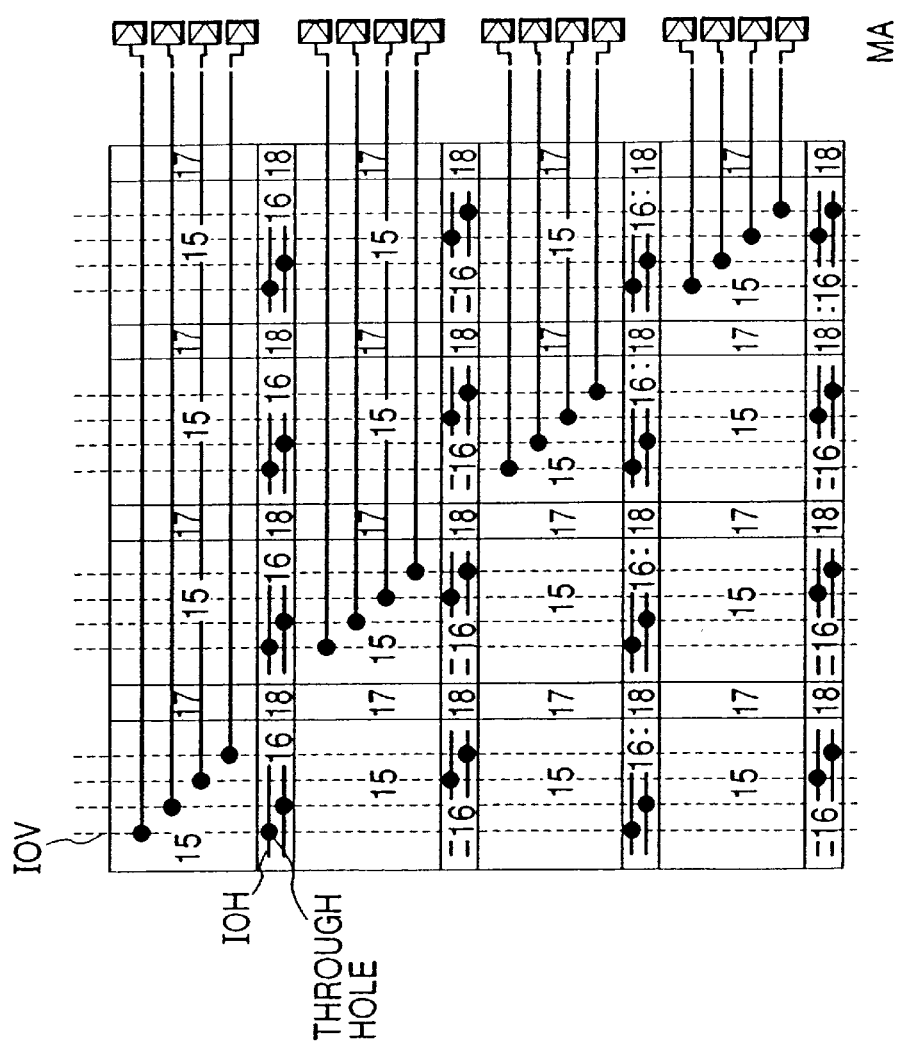

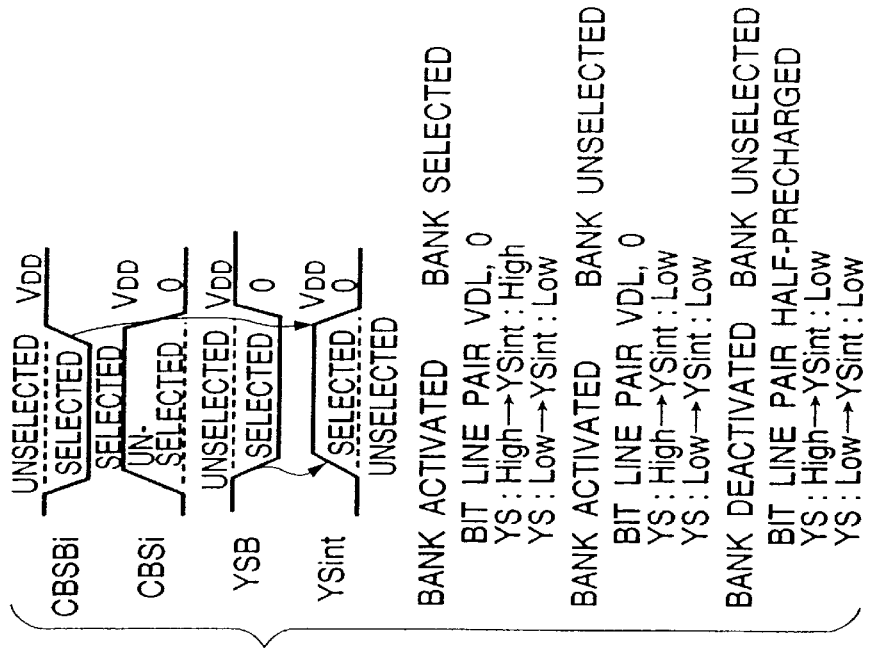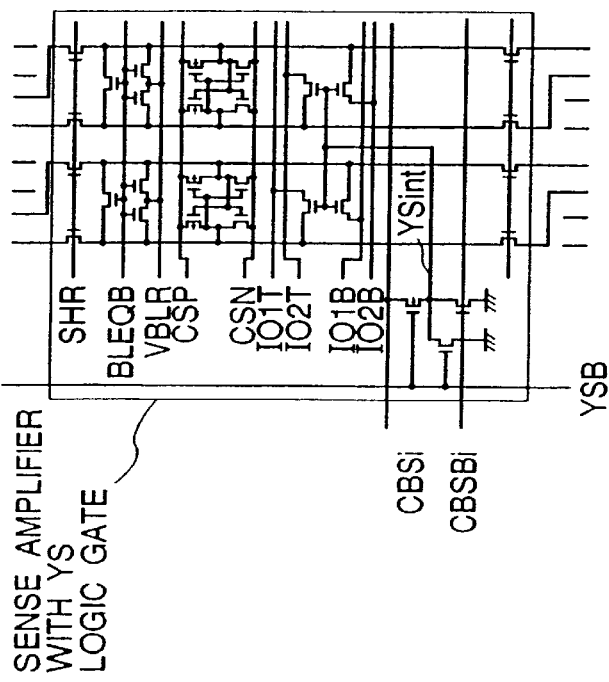
FIG. 12a
FIG. 12b

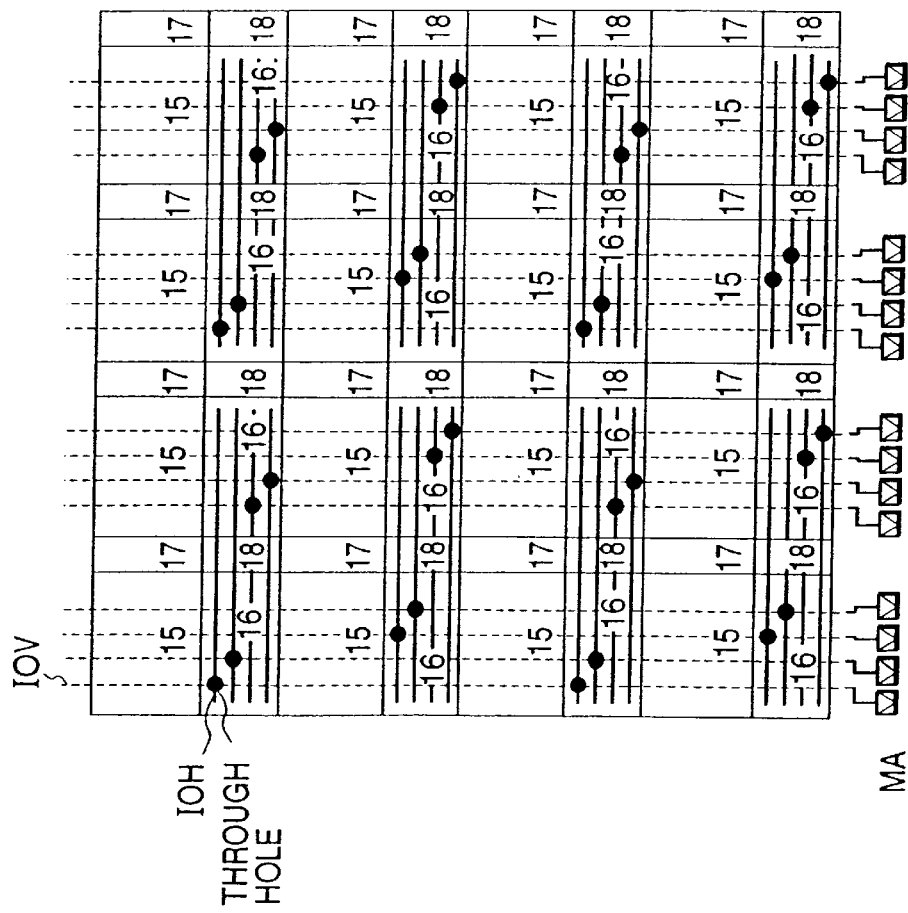

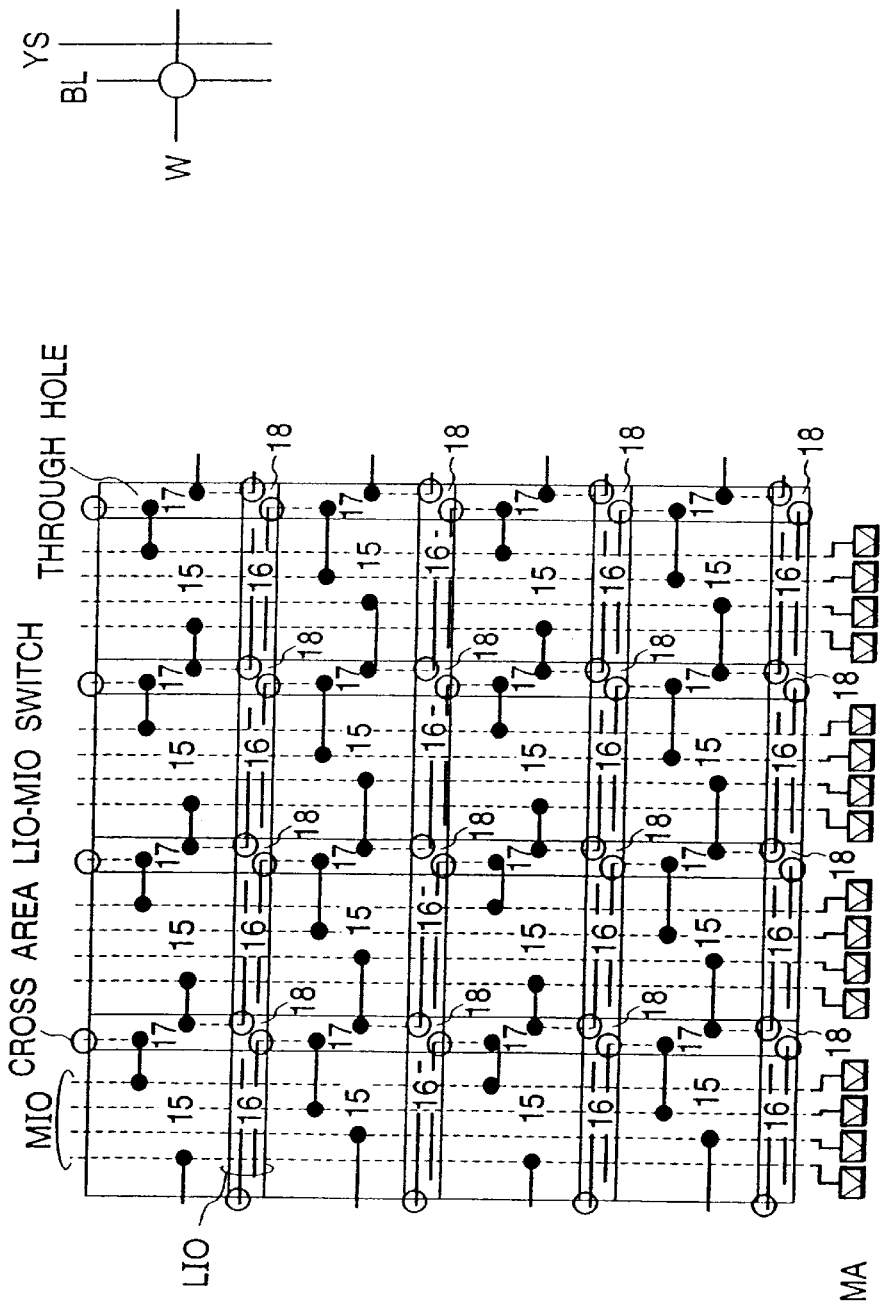

SEMICONDUCTOR DEVICE

CROSS-REFERENCE TO RELATED APPLICATION

This application is a continuation of application Ser. No. 09/357,369, filed on Jul. 20, 1999 now U.S. Pat. No. 6,175,516, the entire disclosure of which is hereby incorporated by reference.

BACKGROUND OF THE INVENTION

The present invention relates to a semiconductor memory device; and, more specifically, the invention relates to a memory cell array system capable of accessing (inputting and outputting) an ultra-large number of bits in a dynamic memory simultaneously.

In connection with various semiconductor memory devices that have been studied by the inventor of this invention, such as DRAMs, there have been growing demands on the memory chip for an increased number of bits to increase the effective band width (frequency×number of input/output bits) of the semiconductor memory system. However, it is not easy to realize an input/output width having an ultra-large bit number, more than 32 bits, such as 128 bits, while preventing an increase in the area of the chip. To realize this requires an improvement in the memory cell array.

A technique for constructing I/O lines in a hierarchical structure is disclosed in Japanese Patent Laid-Open No. 178158/1998, Japanese Patent Laid-Open No. 288888/1997, U.S. Pat. No. 5,657,286 (that corresponds to Japanese Patent Laid-Open No. 334985/1995) and U.S. Pat. No. 5,546,349 (that corresponds to Japanese Patent Laid-Open No. 8251/1997).

SUMMARY OF THE INVENTION

Regarding semiconductor memory devices such as the DRAMs mentioned above, the configuration of the DRAM as a basis for the present invention and the problems, thereof as studied by the inventor will be explained with reference to FIGS. 17a to 20.

FIG. 17a represents an example of a non-hierarchical input/output line system, which is used in 16 Mb DRAMs and 64 Mb DRAMs. The input/output lines IO are arranged on sense amplifiers in parallel with word lines and directly connected to a main amplifier. When a column selection signal line YS is on, the bit lines (BLT, BLB) and the input/output lines IOT, IOB are connected via MOS switches in the sense amplifier. To reduce the parasitic capacitance of the input/output lines IOa, 64 Mb DRAM is formed in a 16 kW×4 kBL pair configuration with the word lines set in the direction of the shorter side, as shown in FIG. 17b. In this system, when multiple bit memory cells are to be accessed (read/written) simultaneously, the number of input/output lines on the sense amplifiers increases (two for each set), which in turn increases the dimension of the sense amplifiers.

In the 64 Mb synchronous DRAM of FIG. 17b, the number of word lines that can be selected in one bank operation is limited to two by the refresh cycle (address pin) standard. If the input and output of 16 bits are performed in the sense amplifier alternate arrangement, it is necessary to arrange four IO pairs on one sense amplifier. If 32 bits are to be input and output, eight IO pairs need to be arranged on a single sense amplifier, increasing the dimension of the sense amplifiers. Because the IO lines are non-hierarchical, the junction capacitance and line capacitance of a large number of MOS switches become parasitic capacitance of the input/output lines IO, causing degradations in the reading and writing speeds.

FIG. 18a represents an example of a hierarchical input/output line system. The principle of the hierarchical input/output line system is disclosed in Japanese Patent Publication No. 59712/1992, and the principle of a technique for combining the hierarchical input/output line system and the hierarchical word line system is disclosed in Japanese Patent Laid-Open No. 181292/1996. The input/output lines comprise local input/output lines LIO and main input/output lines MIO. The local input/output lines LIO are arranged on the sense amplifiers and are associated with a small number of memory cell arrays. In cross areas, the local input/output lines LIO and the main input/output lines MIO are connected by switches MOS. In the case of this figure, the switches MOS between the lines LIO and MIO are analog gates of NMOS and PMOS type. By controlling these gates using sense amplifier precharge signals BLEQ, BLEQB, the switch MOS in the activated sense amplifier is turned on and the switch MOS in the deactivated sense amplifier is turned off. The main input/output lines MIO are arranged on subword drivers perpendicular to the local input/output lines LIO and straddle a number of memory cell arrays.

The hierarchical input/output line system has the following advantages. A first advantage is that it can reduce the total parasitic capacitance associated with the local input/output lines LIO and the main input/output lines MIO and thereby can speed up accesses. A second advantage is that, by dividing the local input/output lines LIO horizontally into a number of sections, it is easier to realize ×16 bits and ×32 bits more easily than it is by the non-hierarchical system shown in FIGS. 17a and 17b. For example, when one word line is selected in FIG. 18a, a number of main input/output line MIO pairs are picked up vertically along a column of subword drivers by the LIO-MIO switch in the cross area. It is, however, significantly harder to realize ×64 bits or more. The reason for this is that, because the main input/output lines MIO are arranged on the subword drivers in parallel with the column selection signal lines YS, the number of bits is limited by the number of subword driver columns. If ×64 bits or more are to be realized, the number of MOS switches in the cross area increases and the number of MIOs on the subword drivers also increases, making the layout more difficult.

FIGS. 19a and 19b represent circuits associated with a memory cell array, also showing subword driver areas 17 (word drivers in the hierarchical word line system) adjacent to a memory cell array area 15 and also a sense amplifier area 16. Sense amplifier drivers and LIO-MIO switches are arranged in cross areas where the sense amplifiers and the subword drivers cross each other (in the hierarchical word line system, cross areas where shared sense amplifiers (shared by upper and lower memory cell arrays) and word drivers cross each other). It is assumed that overdrive sense amplifiers using VDDCLP are used. In this way, a large number of circuits need to be arranged in narrow cross areas defined by the sense amplifiers and the subword drivers and the layout is significantly more difficult. The hierarchical input/output line system requires incorporating LIO-MIO switches, LIO half-precharge circuits and MIO distributed high-precharge circuits, thereby making layout very difficult. Further, increasing the number of bits to more that 64 bits increases the number of LIO-MIO switches. The number of main input/output line MIO pairs extending vertically increases as the number of bits increases and this is a limiting factor affecting the subword driver area.

FIG. 20 is an explanatory diagram showing how the parasitic capacitance is reduced in the hierarchical input/output line system. The hierarchical input/output lines aim to reduce the total parasitic capacitance of LIO and MIO by dividing the local input/output lines LIO and the main input/output lines MIO. The parasitic capacitance of the local input/output lines LIO is the sum of the line capacitance of a second metal line hierarchy M2 and the junction capacitance of m YS switches MOS in the sense amplifier when the lines cross one to four memory cell arrays. The parasitic capacitance of the main input/output lines MIO is the sum of the line capacitance of a third metal line hierarchy M3 and the junction capacitance of LIO-MIO switches MOS in the cross area when the lines cross 2n memory cell arrays. The LIO parasitic capacitance of deactivated memory cell array is not seen. Hence, the occasions where the hierarchical input/output line system is greatly effective in capacitance reduction are when the parasitic capacitance of the local input/output lines LIO is large (LIO are shared by a large number of memory cell arrays arranged in a horizontal direction) and when the value n is large. The junction capacitance of the LIO-MIO switches MOS in the cross area increases as the MOS dimension increases. When the reduction rate of the overall parasitic capacitance is small, the conduction resistance of the switches MOS renders the hierarchical input/output line system not so effective in increasing the access speed when compared with the non-hierarchical input/output line system.

An object of the invention therefore is to provide a semiconductor memory device which can increase the number of bits while considering the parasitic capacitance of the input/output lines, particularly by using an input/output line system wired over the memory cell arrays.

These and other objects and novel features of the invention will become apparent from the description of this specification and the accompanying drawings.

Representative aspects of the invention disclosed in this patent application may be briefly explained below.

The semiconductor memory device according to the invention is applied to an input/output line system that is suited for simultaneous access of a large number of bits. The device does not cause a layout burden in the cross areas nor increase the number of input/output lines on the subword drivers.

A first means for increasing the number of bits uses lines on memory cell arrays (either or both of a second metal line hierarchy M2 and a third metal line hierarchy M3).

A second means uses a simple non-hierarchical input/output line system that eliminates switches in cross areas between local input/output lines and main input/output lines. Unlike FIG. 17, however, both horizontal and vertical input/output lines are used. The connection between the horizontal and vertical input/output lines is made by through holes on the sense amplifiers.

In more concrete terms, a plurality of memory cell sub-arrays are arranged two-dimensionally. The horizontal input/output lines (M2) on the horizontally arranged sense amplifiers are connected, by through holes on the sense amplifiers, to the vertical input/output lines (M3) on a separate hierarchy which cross the horizontal lines at right angles. The vertical input/output lines are arranged over the memory cell arrays in parallel with the column selection signal line so that they cover a plurality of memory cell arrays. The vertical input/output lines are connected to the main amplifiers and write drivers outside the memory cell arrays to enable a large number of bits to be input and output to and from a number of horizontally arranged memory cell arrays at the same time (parallelly).

Alternatively, the vertical input/output lines are arranged on the memory cell arrays in parallel with the column selection signal line. The vertical input/output lines are interconnected by the through holes on the memory cell arrays to convert them into an orthogonal direction. These are arranged to straddle a plurality of memory cell arrays and are connected to the main amplifiers and write drivers outside the memory cell arrays, thereby enabling a large number of bits to be input and output to and from each of the many horizontally arranged memory cell arrays simultaneously.

Alternatively, a plurality of memory cell sub-arrays are arranged two-dimensionally. Horizontal local input/output lines (M2) on the horizontally arranged sense amplifiers are converted by MOS switches in cross areas into vertical main input/output lines (M3) running over subword drivers in a direction perpendicular to the horizontal local input/output lines. In the subword driver column the vertical main input/output lines are again converted by through holes into horizontal M2, which is then converted by through holes on the memory cell arrays into the vertical main input/output lines (M3). The vertical main input/output lines are arranged on the memory cell arrays in parallel with the column selection signal line so that they run through a plurality of memory cell arrays. The vertical main input/output lines are connected to the main amplifier and the write driver to enable a large number of bits to be input and output to and from each of the many horizontally arranged sub-arrays simultaneously.

The above semiconductor memory device employs only the first means or a hierarchical input/output line system, which utilizes lines on the memory cell arrays to increase the number of bits while still using the switches in the cross areas between the local input/output lines and the main input/output lines. Although this does not simplify the cross areas, the increase in the number of input/output lines does not result in an increase in the sub word driver area. This will be explained later to some extent in the description of the embodiment of the invention.

Further, by combining the second means, with the first means, a non-hierarchical input/output line system as well as the lines on the memory cell arrays are utilized to increase the number of bits. This, in combination with an increased bit number, will lead to simplified cross areas. This will be explained later in great detail in the description of the embodiment of the invention.

Further, the semiconductor device comprises:

a first memory array having a plurality of first memory cells;

a second memory array having a plurality of second memory cells;

a first data line extending in a first direction and provided for the first memory array;

a second data line extending in the first direction and provided for the second memory array; and a third data line extending in a second direction perpendicular to the first direction and connected to the first data line and the second data line;

wherein when data read out from selected memory cells of the plurality of the first memory cells is given to the first data line, the second data line and the second memory array are electrically isolated; and wherein when data read out from selected memory cells of the plurality of the second memory cells is given to the second data line, the first data line and the first memory array are electrically isolated.

Further, the semiconductor device comprises:

a plurality of memory arrays each including a plurality of memory cells;

a plurality of first signal transmission lines provided one for each of the plurality of memory arrays and extending in a first direction; and a second signal transmission line extending in a second direction perpendicular to the first direction and connected to the plurality of first signal transmission lines;

wherein when data read out from memory cells contained in one selected memory array of the plurality of memory arrays is supplied to the first signal transmission line that corresponds to the selected memory array, the memory arrays other than the selected memory array and the first signal transmission line corresponding to the selected memory array are electrically isolated.

Further, a semiconductor device comprises:

a first memory array including a first bit line connected with a plurality of first memory cells;

second memory array including a second bit line connected with a plurality of second memory cells;

a first signal transmission line provided for the first memory array;

a second signal transmission line provided for the second memory array;

a first switch connected between the first bit line and the first signal transmission line and controlled by a first signal;

a second switch connected between the second bit line and the second signal transmission line and controlled by a second signal;

a first circuit for receiving a third signal and a fourth signal to form the first signal; and a second circuit for receiving the third signal and a fifth signal different from the fourth signal to form the second signal.

Further, the semiconductor device comprises:

a plurality of memory cell arrays;

a first input/output line extending in a direction parallel to a word line;

a second input/output line formed in a hierarchy different from the first input/output line and extending in a direction perpendicular to the first input/output line; and a main amplifier and a write driver, both connected to the second input/output line;

wherein the first input/output line is formed over an area where a sense amplifier is formed;

wherein the direction perpendicular to the first input/output line is parallel to a bit line;

wherein the first input/output line and the second input/output line are connected by a conductive material filled in a through hole in an area where the sense amplifier is formed;

wherein the second input/output line is located in an area where the plurality of memory cell arrays are formed; and wherein the second input/output line is arranged parallel to a column selection signal line.

Further a semiconductor device comprises:

a plurality of memory cell arrays;

a first input/output line extending in a direction parallel to a word line;

a second input/output line formed in a hierarchy different from the first input/output line and extending in a direction perpendicular to the first input/output line;

a third input/output line extending in a direction perpendicular to the second input/output line; and a main amplifier and a write driver, both connected to the third input/output line;

wherein the first input/output line is formed over an area where a sense amplifier is formed;

wherein the direction perpendicular to the first input/output line is parallel to a bit line;

wherein the second input/output line is parallel to a column selection signal line;

wherein the first input/output line and the second input/output line are connected by a conductive material filled in a through hole in an area where the sense amplifier is formed;

wherein the second input/output line and the third input/output line are connected by a conductive material filled in a through hole in an area where the plurality of memory cell arrays are formed; and wherein the second input/output line and the third input/output line are located in an area where the plurality of memory cell arrays are formed.

Further, a semiconductor device comprises:

a plurality of memory cell arrays;

a first line extending in a direction parallel to a word line;

a second line formed in a hierarchy different from the first line and extending in a direction perpendicular to the first line;

a third line extending in a direction parallel to the second line;

an interconnecting line; and a main amplifier connected to the third line;

wherein the first line is formed over a sense amplifier area;

wherein the direction perpendicular to the first line is parallel to a bit line;

wherein the second line is parallel to a column selection signal line;

wherein the first line and the second line are connected by a conductive material filled in a through hole in a cross area for the plurality of memory cell arrays;

wherein the second line and the interconnecting line are connected by a conductive material filled in a through hole in an area where a word line driver for the plurality of the memory cell arrays is formed;

wherein the third line and the interconnecting line are connected by a conductive material filled in a through hole in an area where the plurality of the memory cell arrays are formed; and wherein the third line is located in an area where the plurality of memory cell arrays are formed.

BRIEF DESCRIPTION OF THE DRAWINGS

FIG. 1a and FIG. 1b are a schematic layout diagram and a partially enlarged view, respectively, of a semiconductor memory device according to one embodiment of the invention.

FIG. 2a and FIG. 2b are schematic layout diagrams showing an input/output line system (base 1) suited for large bit numbers in a semiconductor memory device according to one embodiment of the invention.

FIG. 3a and FIG. 3b are schematic layout diagrams showing input/output line system (base 1–2) suited for large bit numbers in a semiconductor memory device according to one embodiment of the invention.

FIG. 4a and FIG. 4b are schematic layout diagrams showing input/output line system (base 1–3) suited for large bit numbers in a semiconductor memory device according to one embodiment of the invention.

FIG. 5a and FIG. 5b are schematic layout diagrams showing input/output line system (base 1–4) suited for large bit numbers in a semiconductor memory device according to one embodiment of the invention.

FIG. 6a and FIG. 6b are schematic layout diagrams showing input/output line system (base 2) suited for large bit numbers in a semiconductor memory device according to one embodiment of the invention.

FIG. 7a and FIG. 7b are schematic layout diagrams showing input/output line system (base 2–4) suited for large bit numbers in a semiconductor memory device according to one embodiment of the invention.

FIG. 12a and FIG. 12b are explanatory views showing another column selection control method for ranbus DRAM in a semiconductor memory device according to one embodiment of the invention.

FIG. 15a and FIG. 15b are schematic layout diagrams showing input/output line system (base 1–5) suited for large bit numbers in a semiconductor memory device according to one embodiment of the invention.

FIG. 16a and FIG. 16b are schematic layout diagrams showing input/output line system (base 1–6) suited for large bit numbers in a semiconductor memory device according to one embodiment of the invention.

DETAILED DESCRIPTION OF THE INVENTION

Figure 8:
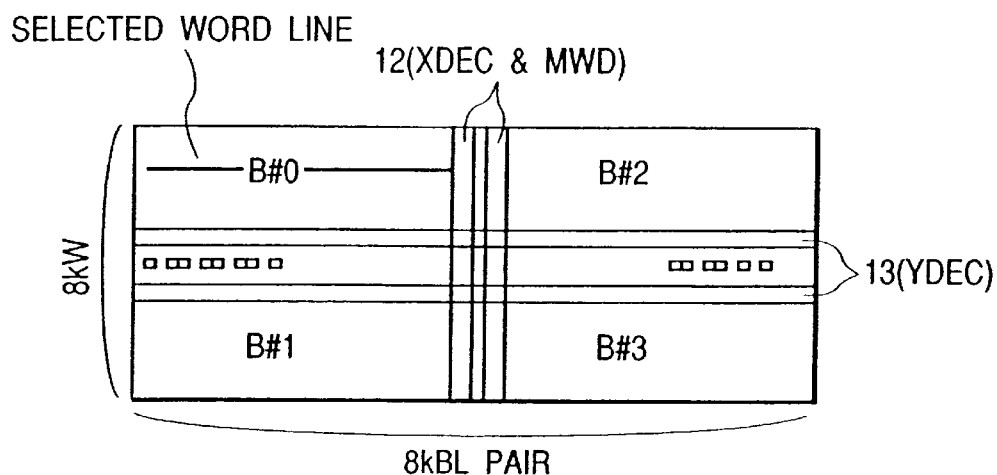
FIG. 8 is a schematic layout diagram showing a chip configuration (synchronous DRAM) in a semiconductor memory device according to one embodiment of the invention.

Now, embodiments of the invention will be described in detail by referring to the accompanying drawings. Identical members throughout all the drawings are assigned like reference numerals and their explanations are not repeated.

Figure 9:
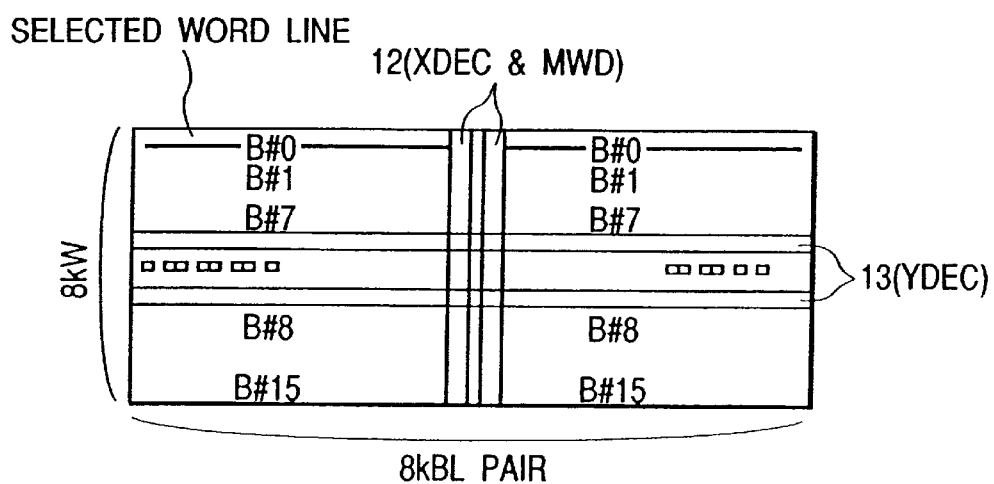
FIG. 9 is a schematic layout diagram showing a chip configuration (ranbus DRAM) in a semiconductor memory device according to one embodiment of the invention.
Figure 13A:
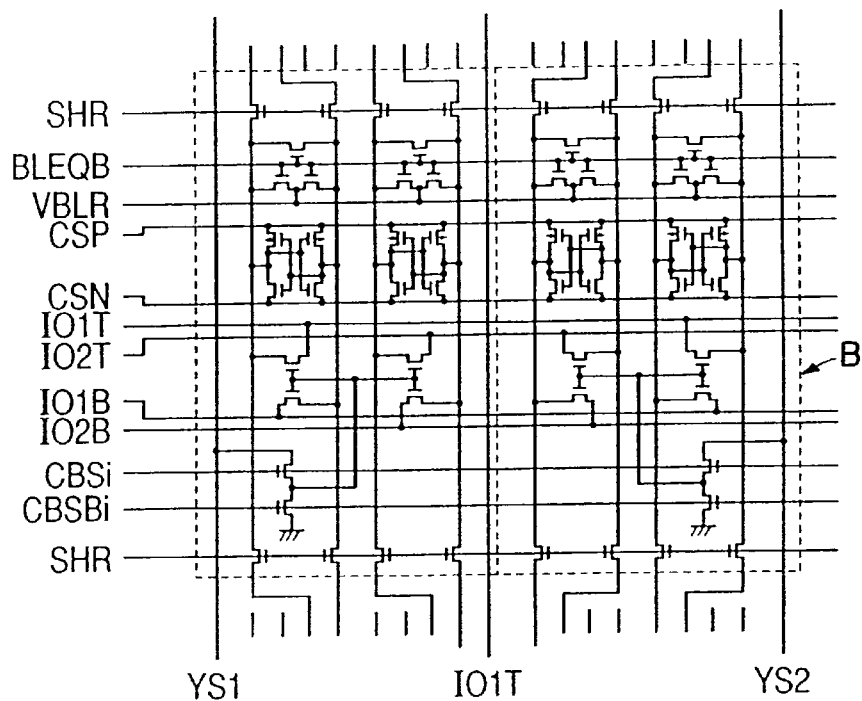
FIG. 13a and FIG. 13b are schematic layout diagrams showing a sense amplifier in a semiconductor memory device according to one embodiment of the invention.
Figure 13B:
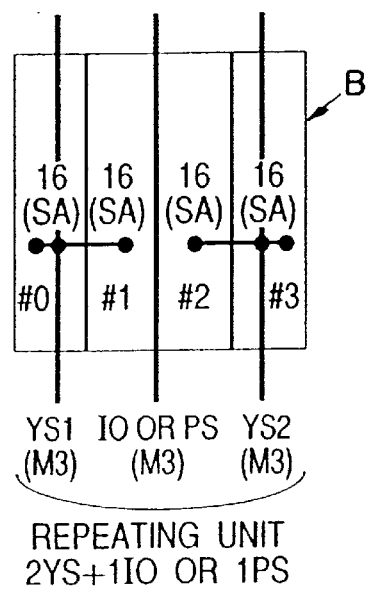
Figure 14:
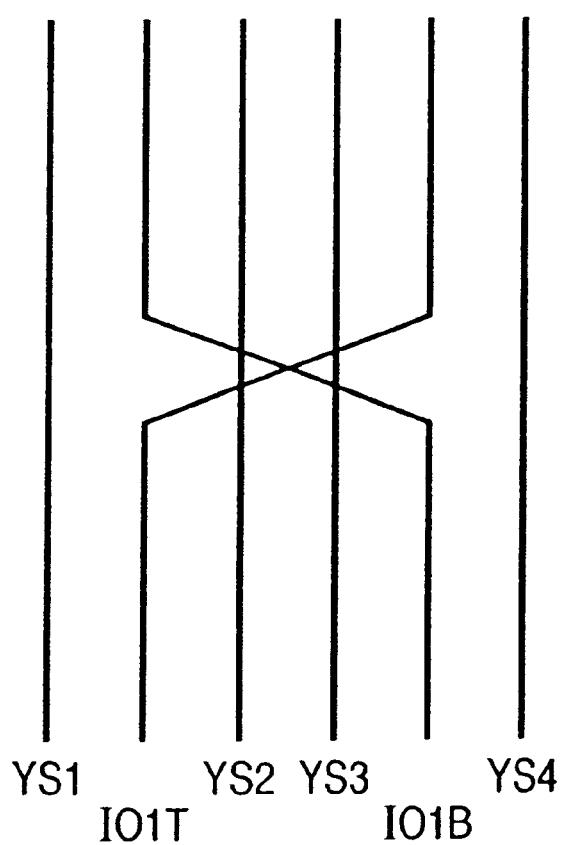
FIG. 14 is an explanatory view showing a twisted structure of input/output lines in a semiconductor memory device according to one embodiment of the invention.

FIG. 1a and FIG. 1b are a schematic layout diagram and a partially enlarged view of a semiconductor memory device according to one embodiment of the invention. FIGS. 2a to 7b, 15a, 15b, 16a and 16b are schematic layout diagrams showing input/output line systems suited for large bit numbers in a semiconductor memory device according to one embodiment of the invention. FIGS. 8 and 9 are schematic layout diagrams showing a chip configuration of a semiconductor memory device. FIGS. 10 to 12b are explanatory views showing column selection control methods. FIGS. 13a and 13b are schematic layout diagrams showing a sense amplifier. FIG. 14 is an explanatory view showing a twisted structure of input/output lines for noise reduction.

First, by referring to FIGS. 1a and 1b the layout configuration of a semiconductor memory device according to one embodiment of the invention will be described. FIG. 1a is a schematic layout diagram of a semiconductor memory device and FIG. 1b is a partially enlarged view of the same.

The semiconductor memory device according to this embodiment is, for example, a 64 Mb DRAM. This memory chip 10 includes a main row decoder area 11, main word driver areas 12, column decoder areas 13, a peripheral circuit/bonding pad area 14, memory cell array areas 15, sense amplifier areas 16, subword driver areas 17, cross areas 18, etc., all formed with known semiconductor manufacturing technologies.

In this 64 Mb DRAM, the basic memory cell arrays in the memory cell array areas 15 are constructed, for example, in a 512 word line (W)×512 bit line pair (BL pair) configuration. The word lines extend in the longer side direction and the bit lines in the shorter side direction. Using a hierarchical word line configuration and a multiple division bit line configuration, a total of 64 M bits are formed in 8 k word line×8 k bit line pairs.

In this memory chip 10, main word lines and predecoder lines for controlling drivers in the subword driver areas 17 are output to left and right from the main row decoder area 11 and the main word driver areas 12 at the center of the longer side. At the center of the shorter side is arranged the peripheral circuit/bonding pad area 14. Between the peripheral circuit/bonding pad area 14 and the memory cell array areas 15 are arranged the column decoder areas 13. The column selection signal lines output from the column decoders pass over the memory cell array areas 15 to control a large number of sense amplifiers.

As shown in the partially enlarged view of FIG. 1b, on left and right sides of each of the memory cell array areas 15 are the subword driver areas 17, and on top and bottom sides of each memory cell array area 15 are the sense amplifier areas 16. Hence, the memory cell array areas 15 are each enclosed by the sense amplifier areas 16 and the subword driver areas 17. The areas where the subword driver areas 17 and the sense amplifier areas 16 cross each other are called cross areas 18, in which sense amplifier drivers and switch circuits for the input/output lines are provided.

Next, by referring to FIGS. 2a to 7b, the input/output line system according to the invention suited for simultaneous access to a large number of bits will be explained of these figures, FIGS. 2a, 3a, 4a, 5a, 6a and 7a are schematic layout diagrams showing the input/output lines arranged on the memory cell array areas 15, sense amplifier areas 16, subword driver areas 17 and cross areas 18, with solid lines representing horizontal input/output lines IOH parallel to the word lines W, dashed lines representing vertical input/output lines IOV parallel to the bit lines BL, and black dots representing through holes. Although only 4×4=16 memory cell array areas 15 are shown for simplicity, actually a greater number of memory cell array areas are used in the horizontal and vertical directions. FIGS. 2b, 3b, 4b, 5b, 6b and 7b correspond to FIGS. 2a, 3a, 4a, 5a, 6a and 7a, respectively, and show the layout directions of the word lines W and bit lines BL connected to memory cells in the memory cell array areas 15 and also the layout direction of the column selection signal lines YS.

FIGS. 2a and 2b represent a basic example (base 1) of the invention. In FIGS. 2a and 2b, for each horizontal input/output line IOH the through holes on the sense amplifiers connect the second metal line hierarchy M2 and the third metal line hierarchy M3. The vertical input/output lines IOV pass through a plurality of memory cell arrays in parallel with the column selection signal lines YS and connect to main amplifiers MA outside the memory cell arrays. By selecting an appropriate repeating pitch of the column selection signal lines YS, it is possible to arrange the input/output lines in the same hierarchy as the YS (described later). Half-precharge and VDL precharge circuits of the input/output lines may be located near the main amplifiers MA or in cross areas. IOH, IOV and MA have one-to-one correspondence and thus the sense amplifiers may use a simple YS control as in the case of the technology that serves as a basis of the invention. In unselected memory cell arrays, bit lines are half-precharged and thus the input/output lines connected to them are preferably half-precharged. Selecting a greater number of word lines W enables a greater number of bits to be output. If the sense amplifiers perform logic control, described later, which is based on the column selection signal lines YS and the horizontal sense amplifier status signals, the input/output lines half precharging is not necessary and only the input/output line VDL precharging is needed.

FIGS. 3a and 3b represent a basic example (base 1–2) of the invention. Unlike the preceding example shown in FIGS. 2a and 2b, the vertical input/output lines IOV are each connected by a plurality of sense amplifiers. The sense amplifiers require the logic control based on the column selection signal lines YS and the horizontal sense amplifier status signals. This is to protect the voltage of the half-precharged bit lines in the deactivated sense amplifiers against being disturbed and to prohibit signal input/output between the unselected memory cell arrays and the input/output lines. This obviates the need to half-precharge the input/output lines, which then require only the VDL precharging.

FIGS. 4a and 4b represent a basic example (base 1–3) of the invention. Unlike the preceding example shown in FIGS. 2a and 2b, selector switches SW are provided near the main amplifiers MA to throttle the input/output from the unselected memory cell arrays. This example is suited for a case where the number of main amplifiers MA cannot be increased.

FIGS. 5a and 5b represent a basic example (base 1–4) of the invention. Unlike the preceding example shown in FIGS. 2a and 2b, two pairs of horizontal input/output lines IOH are arranged on the sense amplifiers to connect the vertical input/output lines IOV by a plurality of memory cell arrays. The sense amplifiers require a logic control based on the column selection signal lines YS and the horizontal sense amplifier status signals. In the sense amplifier alternate arrangement system, the sense amplifiers on the upper and lower sides of the selected memory cell array are activated and thus two pairs for each sense amplifier, i.e., a total of four pairs, can be input and output. Therefore, one memory cell array can perform input/output of four bits. If 32 memory cell arrays are arranged in the horizontal direction, 32×4=128 bits can be input/output simultaneously.

Figure 17A:
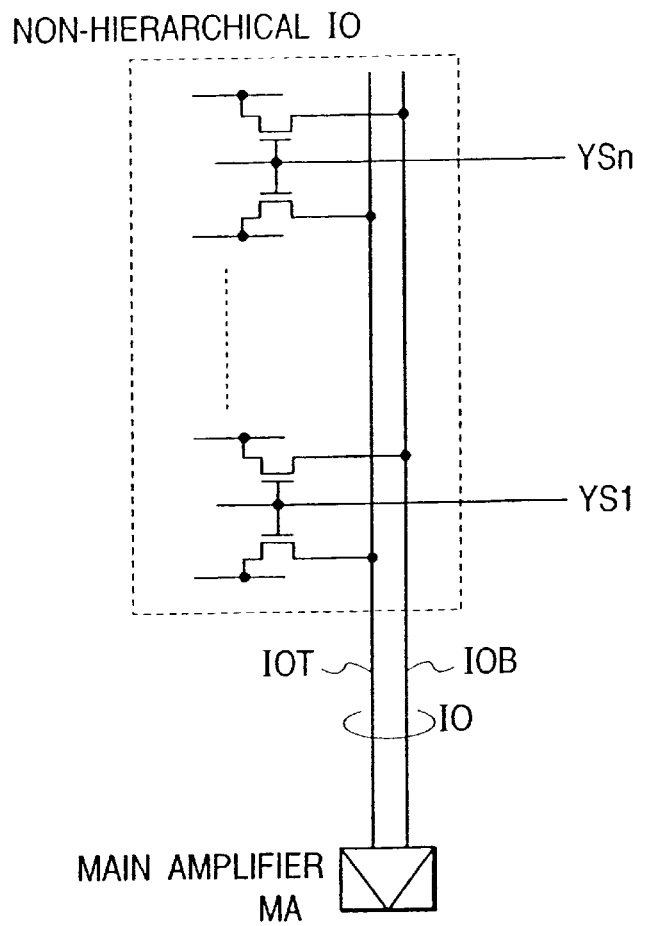
FIG. 17a and FIG. 17b are explanatory views showing a non-hierarchical input/output line system in a semiconductor memory device that serves as a basis for the invention.
Figure 17B:
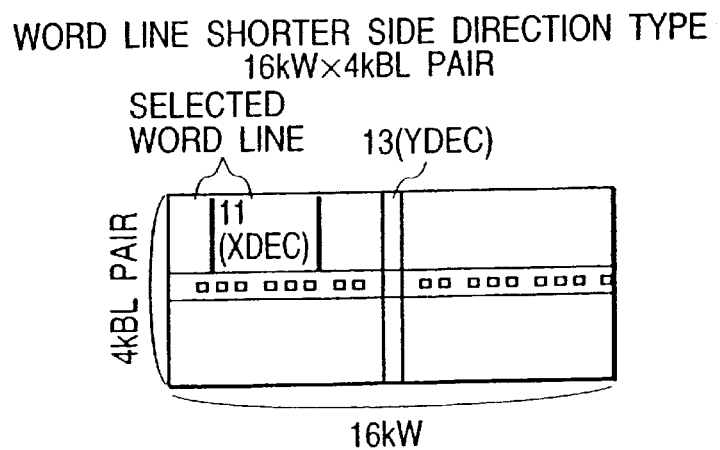

FIGS. 6a and 6b represent a basic example (base 2) of the invention. It is assumed, as in the preceding examples, that the word lines W extend in the horizontal direction and the bit lines BL and column selection signal lines YS extend in the vertical direction. FIGS. 6a and 6b correspond to FIGS. 2a and 2b. The point in which FIGS. 6a and 6b and FIGS. 7a and 7b described later most distinctly differ from FIGS. 2a to 5b is that both the horizontal input/output lines IOH and the vertical input/output lines IOV are arranged on the memory cell arrays. In FIGS. 6a and 6b, the horizontal input/output lines IOH on the sense amplifiers are converted into a vertical direction by using through holes on the sense amplifiers and then into a horizontal direction by using through holes on the memory cell arrays, and then connected to the main amplifiers MA outside the memory cell arrays. Horizontal lines of the second metal line hierarchy M2 are arranged between the main word lines or between predecoder lines (FXB) by applying the M2 pitch alleviation according to the hierarchical word line system. By using an appropriate repeating pitch of the lines of the second metal line hierarchy M2, it is possible to lay input/output lines in the same second metal line hierarchy M2. In this system, the chip is configured so that the word lines extend in the shorter side direction as shown in FIG. 17a and can increase the bit numbers without increasing the number of lines on the sense amplifiers significantly. The sense amplifiers may use a simple YS control, as they do in the technology that serves as the basis of the invention. In the unselected memory cell arrays, the bit lines are half-precharged and thus the input/output lines connected to them are preferably half-precharged. Selecting an increased number of word lines W can increase the number of bits to be output. If the sense amplifiers perform a logic control based on the column selection signal lines YS and the horizontal sense amplifier status signals, the input/output lines do not need to be half-precharged.

FIGS. 7a and 7b represent a basic example (base 2–4) of the invention. FIGS. 7a and 7b correspond to FIGS. 5a and 5b. Unlike the example of FIGS. 6a and 6b, the vertical input/output lines IOV are connected by a plurality of sense amplifiers. The sense amplifiers require a logic control based on the column selection signal lines YS and the horizontal sense amplifier status signals. This is to protect the voltage of the half-precharged bit lines in the deactivated sense amplifiers against being disturbed and to prohibit signal input/output between the unselected memory cell arrays and the input/output lines. This obviates the need to half-precharge the input/output lines, which then require only the VDL pre-charging. The VDL precharge circuits are located in cross areas or near the main amplifiers MA.

As shown in FIGS. 2a to 7b, although this invention is effective in vastly increasing the access bit number of the DRAM of the technologies serving as the basis for the invention and also of the synchronous DRAM, it is more effective to apply the invention to the memory chips, particularly ranbus DRAMs, with ultra-large numbers of bits and large numbers of banks. The difference between them will be briefly explained in terms of memory cell array structure by referring to FIGS. 8 to 14.

FIG. 8 shows a chip configuration of a 64 Mb synchronous DRAM. The feature of this chip is a four-bank configuration (B#0–B#3), with each bank corresponding to one-fourth of the chip. Because each bank has a column decoder YDEC, the column selection signal line YS needs only to perform a simple control on the sense amplifiers. That is, when one bank is selected, there are one or two activated sense amplifiers and a number of deactivated sense amplifiers in the bank. When the column selection signal line YS is high, deactivated sense amplifiers have no effect as long as the bit lines and input/output lines are half-precharged. When the column selection signal line YS is high, the activated sense amplifiers transfers (reads/writes) information to and from the input/output lines.

FIG. 9 shows a chip configuration of a 64 Mb ranbus DRAM. The feature of this chip is a 16-bank configuration (B#0–B#15), with each bank corresponding to horizontally arranged one or two columns of memory cell arrays. Hence, the column decoder YDEC controls both of the unselected and selected banks by the common column selection signal line YS. If the column decoder YDEC is assigned to each bank, 16 column decoders YDEC will be necessary. It is therefore necessary for the sense amplifiers to perform logic calculations based on the column selection signal line YS and the bank selection information and control the YS switches with the output of the logic calculation. This resembles the relation between the main word line and the subword line in the hierarchical word line system. As in the subword driver, a YS hybrid circuit that takes a logic from the main word line and the predecoder line is provided in the sense amplifiers.

Figure 10:
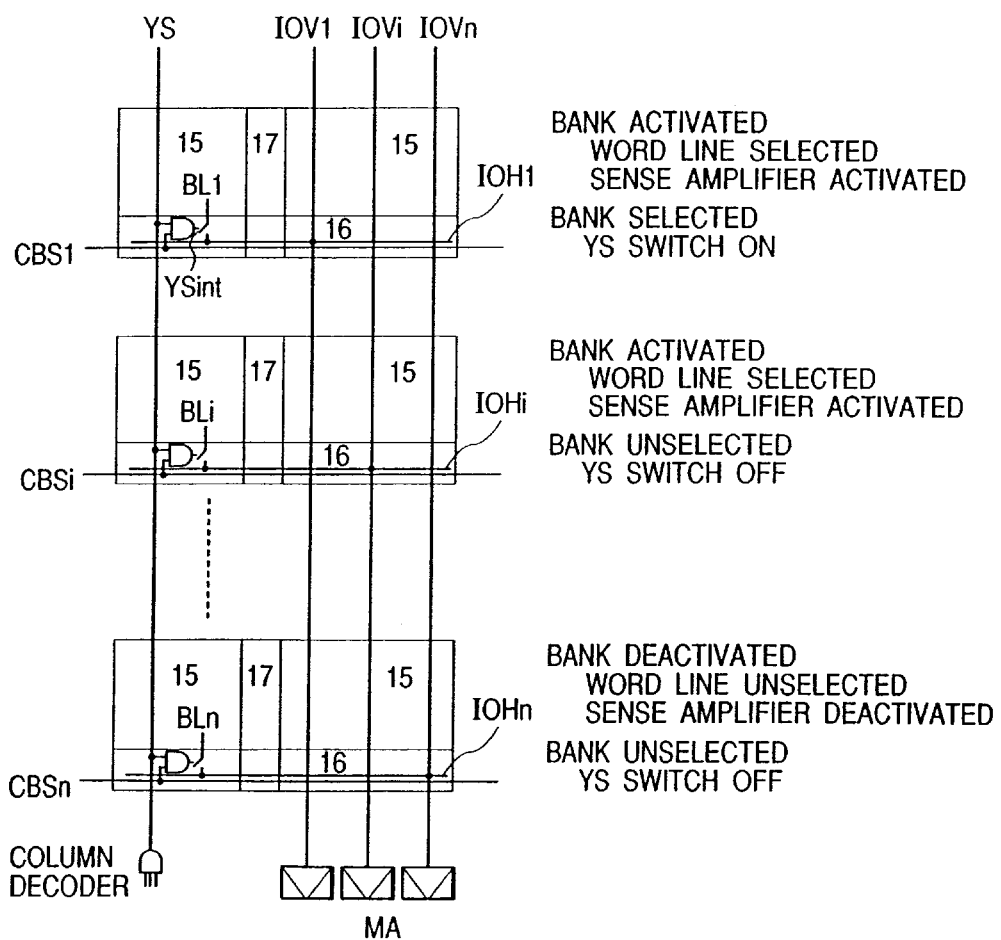
FIG. 10 is an explanatory diagram showing a bank control method for ranbus DRAM in a semiconductor memory device according to one embodiment of the invention.

FIG. 10 shows the relation between the column selection signal line YS for controlling a plurality of banks such as ranbus DRAMs with a common column decoder and the states of the plurality of banks. There are three states for a sense amplifier.

The first state is a bank deactivated, bank unselected state. The input/output lines IO are unselected. In this case, the bit line is half-precharged. The YS hybrid circuit is controlled by a bank selection signal CBSn so that when the common column selection signal line YS is high, a column selection signal YSint in the sense amplifier column is low.

The second state is a bank activated, bank unselected state. The input/output lines IO are unselected. The bit line is separated into high (VDL) and low (0V) by the sense amplifier. The YS hybrid circuit is controlled by the bank selection signal CBSi so that when the common column selection signal line YS goes high, the column selection signal YSint in the sense amplifier column goes Low.

The third state is a bank activated, bank selected state. The input/output lines IO are selected and input/output information appears. The bit line is separated into high (VDL) and low (0V) states by the sense amplifier. The YS hybrid circuit is controlled by the bank selection signal CBS1 so that when the common column selection signal line YS goes high, the column selection signal YSint in the sense amplifier column goes high.

Figure 11B:
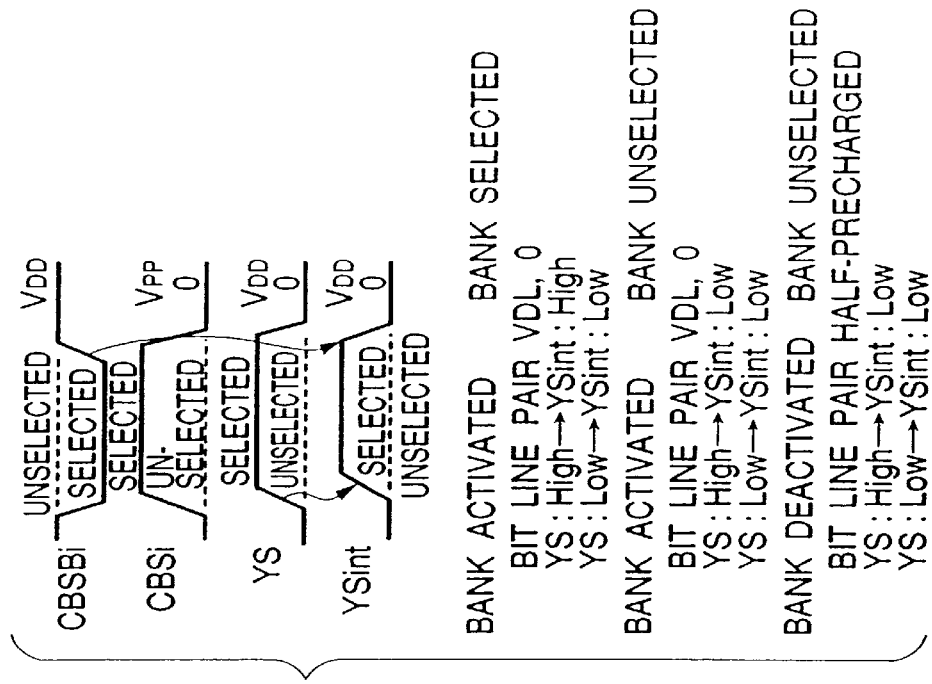
FIG. 11a and FIG. 11b are explanatory views showing a column selection control method for ranbus DRAM in a semiconductor memory device according to one embodiment of the invention.
Figure 11A:
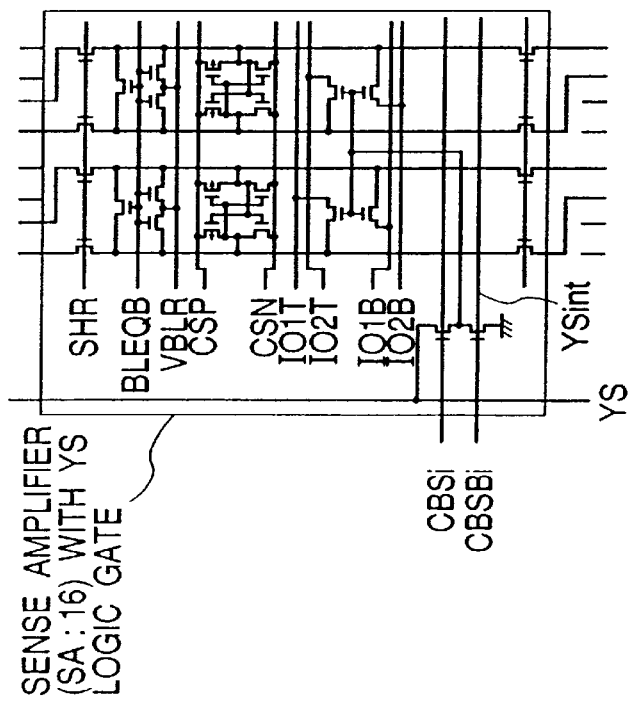

FIGS. 11a and 11b show an example of the YS hybrid circuit (1YS-2SA control) in the sense amplifier SA described above, with FIG. 11a representing the circuitry and FIG. 11b representing a waveform diagram. The YS hybrid circuit, though it may be an ordinary CMOS inverter, can be constructed of only two NMOSs. If the bank selection signal CBSi is at a VPP high level, the YSint high level can be set equal to the high level of YS. In FIGS. 11a and 11b, SHR represents a shared sense amplifier separation signal line, BLEQB represents a bit line precharging signal line, VBLR represents a bit line precharging voltage line, and CSP and CSN represent sense amplifier drive lines.

FIGS. 12a and 12b show another example of a YS hybrid circuit which, unlike FIG. 11a of the NMOS type, The line is of a CMOS type. YSB is selected when it is low and unselected when it is high. Compared with FIGS. 11a and 11b, this YS hybrid circuit has the advantage that CBSi, CBSBi and YSB need only be at a non-boost level (VDD or low level). The disadvantage is that it requires PMOS. The reason that YSB is used for a gate input and CBSi for a source input is to balance the load capacitance considering the number of circuits. The junction capacitance of one MOS is about ¼ of the gate capacitance. By connecting the CBSi having a large number of load circuits to the source and the YSB line having a small number of load circuits to the gate, it is possible to reduce the delay time in generating YSint from YSB and CBSi.

FIGS. 13a and 13b show how the column selection signal line YS and the input/output line IO pass through the sense amplifier. FIG. 13a is a circuit diagram and FIG. 13b a layout conceptual diagram. One column selection signal line YS controls two sense amplifiers SA. Two column selection signal lines YS and one input/output line IO are arranged in the width direction of four sense amplifiers. In the sense amplifier SA alternate arrangement, this means results in an 8-bit line pair width. Where the input/output lines IO are not needed, power source lines PS may be used instead of IO.

FIG. 14 shows a twisted structure of an input/output line pair to reduce noise induced by the column selection signal lines YS of the input/output lines IO. The twisting of the input/output lines IO is preferably made on the sense amplifier located at roughly a mid point of the overall length of the IO. Because the true T side and bar B side of the input/output lines IO oppose one column selection signal line YS on the memory cell array over the same length, the amounts of noise voltage induced by the rising and trailing edges of the column selection signal line YS are equal and of the same phase and thus the operation of the main amplifier is not affected.

Next, by referring to FIGS. 15a and 15b, a basic example (base 1–5) of the 1YS–4SA control according to the invention will be explained. As shown in the control conceptual diagram of FIG. 15b, the 1YS–4SA control controls four sense amplifiers SA by means of one column selection signal line YS.

Unlike the preceding example of FIG. 5, this example as shown in FIGS. 15a and 15b has four pairs of horizontal input/output lines IOH on the sense amplifiers which cover two memory cell arrays. The number of input/output lines that can be used is the same as in FIG. 5. That is, because there are 8 IOs for every two memory cell arrays, one memory cell array has 4 IOs. Because one column selection signal line YS controls four sense amplifiers SA, the required pitch of the column selection signal lines YS is further alleviated and the YS hybrid circuit needs only to be arranged within the width of four sense amplifiers.

Next, by referring to FIGS. 16a and 16b, a basic example (base 1–6) that combines the hierarchical input/output line system of this invention and the on-memory-cell-array input/output line system will be explained.

Figure 18A:
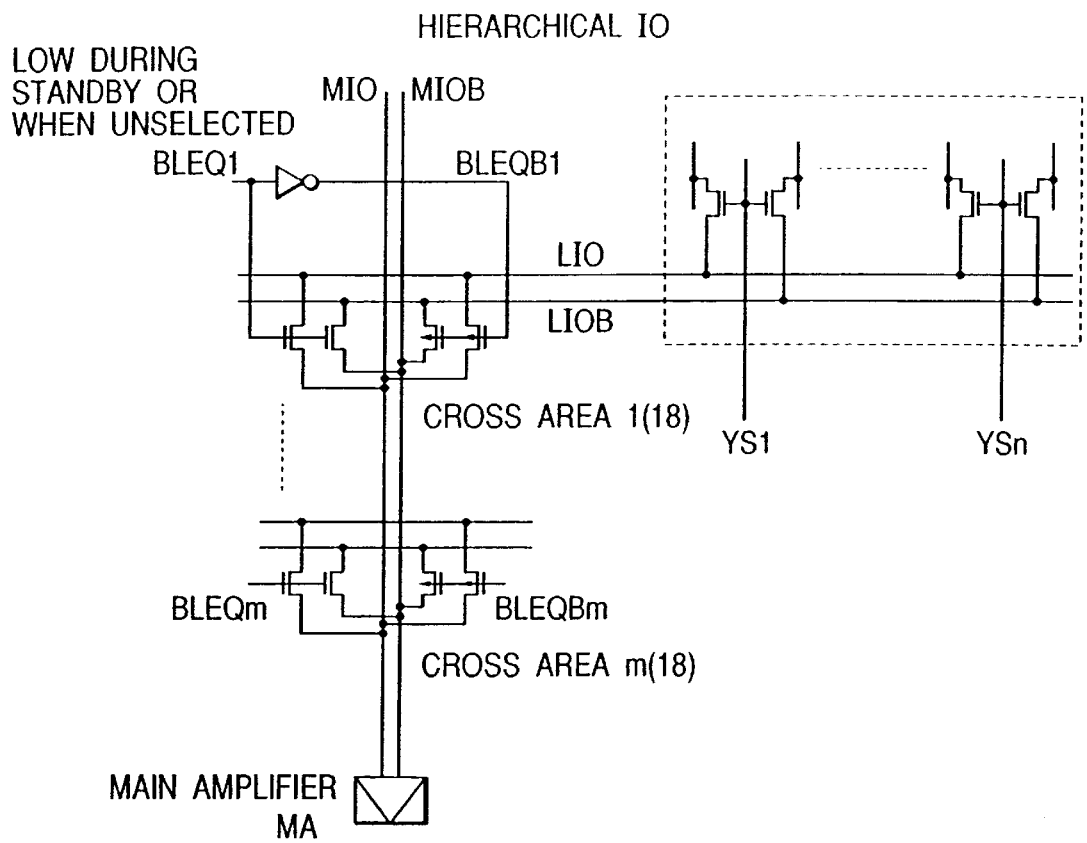
FIG. 18a and FIG. 18b are explanatory views showing hierarchical input/output line system in a semiconductor memory device that serves as a basis for the invention.
Figure 18B:
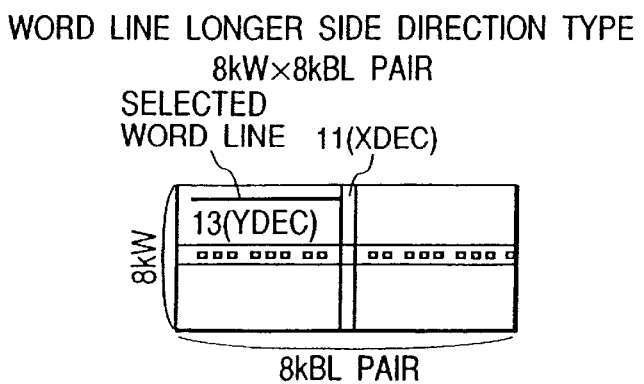
Figure 19A:
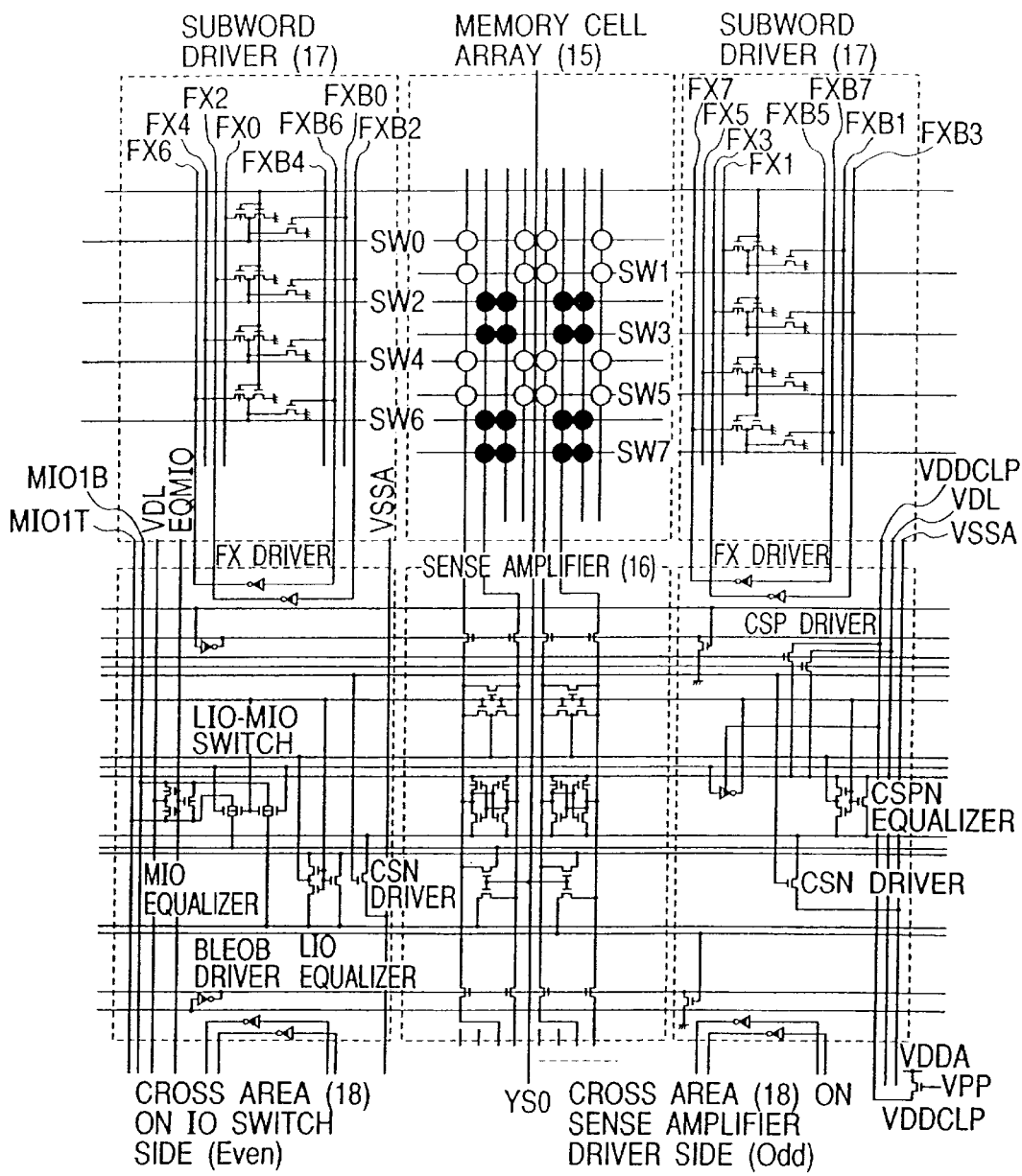
FIG. 19a and FIG. 19b are diagrams showing circuits associated with a memory cell array in a semiconductor memory device that serves as a basis for the invention.
Figure 19B:
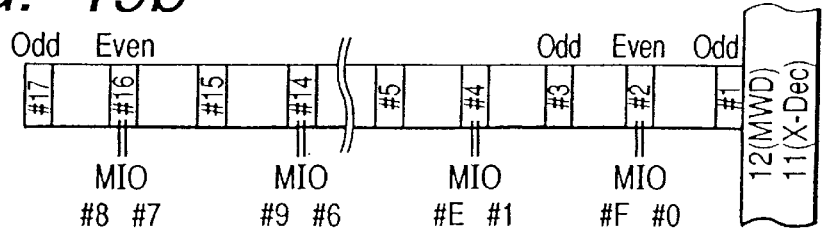
Figure 20:
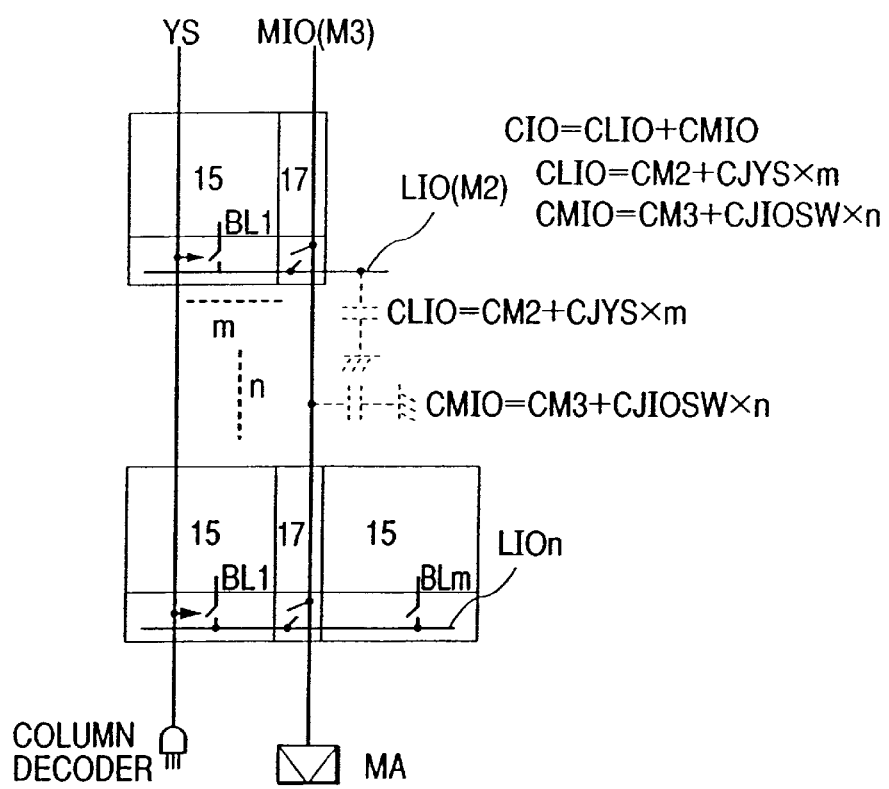
FIG. 20 is an explanatory view showing parasitic capacitance of the hierarchical input/output line system in a semiconductor memory device that serves as a basis for the invention.

FIGS. 16a and 16b combine the example of FIG. 5 with the hierarchical input/output lines. Two pairs of local input/output lines LIO are arranged on the sense amplifiers. These local input/output lines LIO are connected to the main input/output lines MIO through LIO-MIO switches in the cross area, are extended horizontally via the through holes on the subword driver, are connected to the vertical main input/output lines MIO via the through holes on the memory cell array, extend through a plurality of memory cell arrays, and then connect to the main amplifiers MA. The sense amplifiers are simple switches having only the column selection signal line YS. In the sense amplifier alternate arrangement system, the sense amplifiers on the upper and lower sides of the selected memory cell array are activated. The sense amplifiers can input and output two pairs each, i.e., a total of four pairs. Hence, one memory cell array can input and output four bits. When 32 memory cell arrays are arranged in the horizontal direction, 32×4=128 bits can be input and output simultaneously. The advantage of this system is that because only one pair of IOs are required to be provided on the subword driver, the area occupied by the subword driver does not become a limiting factor in wiring. However, arranging two sets of LIO-MIO switches at one location in the cross area is not easy in terms of layout. For this reason, rather than using a combination of PMOS and NMOS as the LIO-MIO switch, which was described with reference to FIG. 18a, it is necessary to use only NMOS to reduce the area.

Therefore, according to the semiconductor memory device of this embodiment, a large number of bits can be input and output by a system that uses the non-hierarchical input/output line system such as shown in FIGS. 2a–5b, 15a and 15b to convert the horizontal input/output lines to the vertical input/output lines, a system that uses the non-hierarchical input/output line system such as shown in FIGS. 6 and 7 to convert the horizontal input/output lines to the vertical input/output lines and to the horizontal input/output lines, and a system that uses the hierarchical input/output line system such as shown in FIG. 16 to convert the horizontal input/output lines to the vertical input/output lines.

Next, FIGS. 21a and 21b will be explained.

Figure 21B:
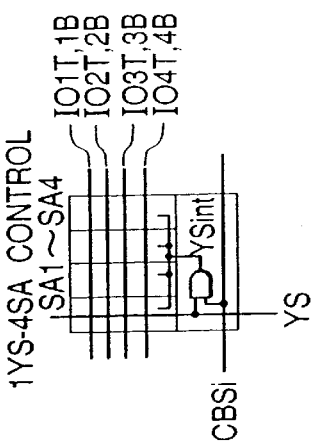
FIG. 21a and FIG. 21b are schematic layout diagrams showing input/output system suited for large bit numbers in a semiconductor memory device according to one embodiment of the invention.
Figure 21A:
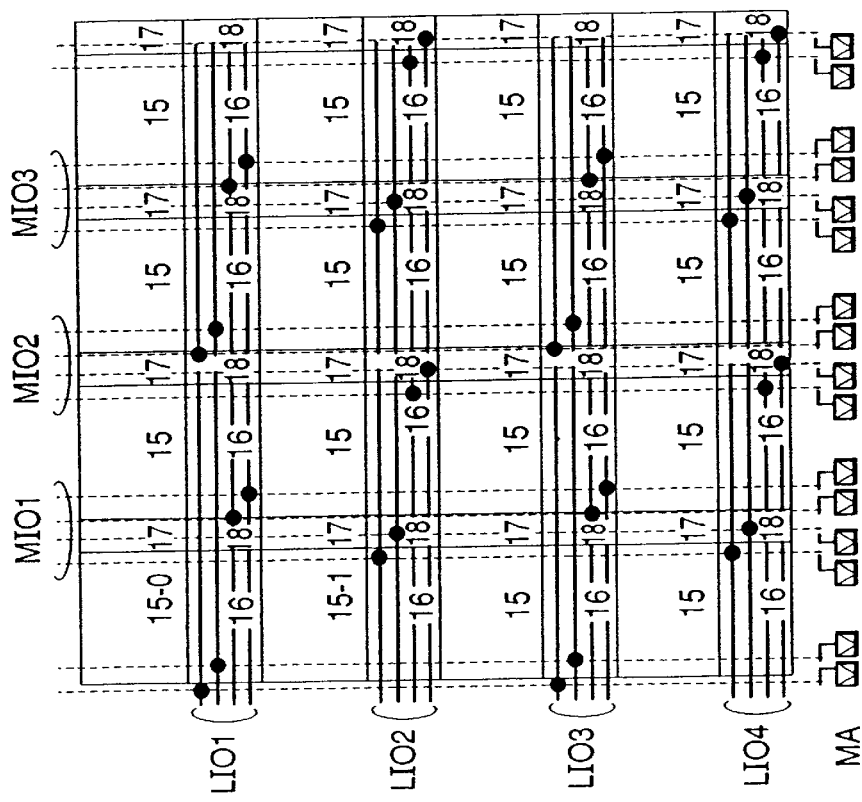

FIGS. 21a and 21b show another example of the layout of the local input/output lines LIO1-3 and the main input/output lines MIO1-3.

In these figures, parts of the local input/output lines and main input/output lines are connected by through holes on the subword driver 17.

While parts of the main input/output lines are connected to the local input/output lines on the memory cell array, it is possible to connect all the main input/output lines and local input/output lines on the subword drivers. That is, parts of the main input/output lines and local input/output lines may be connected on the memory array areas while the other main input/output lines and local input/output lines may be connected in areas other than the memory array areas. It is also possible to connect all the main input/output lines and local input/output lines on other areas than the memory array areas, for example, on the subword driver areas. It is also possible to connect all the main input/output lines and local input/output lines on the memory array areas. That is, many possible variations can be considered for locations where the main input/output lines and the local input/output lines, that are formed in different layout hierarchies with an insulating hierarchy interposed therebetween, can be connected by a conductive material filled in the through holes.

The invention has been described in detail in conjunction with various embodiments. It should be noted that the invention is not limited to these embodiments and that various modifications may be made without departing from the spirit of the invention.

For example, although the preceding embodiments concern a case where the invention is applied to the 64 Mb DRAM, the invention can widely be applied to large capacity DRAMs of 128 Mb and 256 Mb and to synchronous DRAMs. The adoption of a large capacity configuration in this way enhances the effect produced by this invention.

Representative advantages of the invention may be briefly summarized as follows.

(1) The non-hierarchical input/output line system that uses on-the-memory-cell-array lines and the horizontal and vertical input/output lines can produce a number of input/output bits from each of a number of memory cell arrays arranged along the selected word line. Therefore, it is possible to realize a simultaneous input/output of an ultra-large number of bits, such as 128 bits, without making a large sacrifice of increasing the chip area.

(2) The invention is not limited to the non-hierarchical input/output line system. If the non-hierarchical input/output line system is combined with the hierarchical input/output line system which has switches in the cross area between the local input/output lines and the main input/output lines, the feature of low parasitic capacitance of the hierarchical input/output lines can be utilized to further increase the number of bits and the access speed at the same time.

We claim:

1. A semiconductor device comprising:
   a first memory array having a plurality of first memory cells;
   a second memory array having a plurality of second memory cells;
   a first data line formed in a first layer, extending in a first direction and provided for said first memory array, wherein data readout from a selected memory cell of said plurality of first memory cells is provided to said first data line;
   a second data line formed in said first layer, extending in said first direction and provided for said second memory array, wherein data read out from a selected memory cell of said plurality of second memory cells is provided to said second data line; and
   a third data line formed in a second layer which is different from said first layer and extending in a second direction perpendicular to said first direction, said third data line being provided for said first and second data lines,
   wherein said third data line is formed on said first memory array and said second memory array.

2. A semiconductor device according to claim 1,
   wherein said first data line is a first local data line,
   wherein said second data line is a second local data line, and
   wherein said third data line is a main data line.

3. A semiconductor device according to claim 1,
   wherein said first data line and said third data line are connected by a conductive material filled in a first through hole, said first through hole being formed on said first memory array, and wherein said second data line and said third data line are connected by a conductive material filled in a second through hole, said second through hole being formed on said second memory army.

4. A semiconductor device comprising:
a first memory array having a plurality of first memory cells;
a second memory array having a plurality of second memory cells;
a first data line extending in a first direction and provided for said first memory array;
a second data line extending in said first direction and provided for said second memory array;
a third data line extending in a second direction perpendicular to said first direction, said third data line being provided for said first and second data lines;
a first switch circuit;
a second switch circuit; and
a plurality of selection lines to apply a plurality of selection signals to said first and second switch circuits,
wherein said first memory array includes a plurality of word lines extending in said first direction and a plurality of data lines extending in said second direction,
wherein said second memory array includes a plurality of word lines extending in said first direction and a plurality of data lines extending in said second direction,
wherein said first switch circuit is connected between said plurality of data lines of said first memory array and said first data line and is controlled by a plurality of selection signals,
wherein said second switch circuit is connected between said plurality of data lines of said second memory array and said second data line and is controlled by said plurality of selection signals, and
wherein said third data line is formed on said first memory array and said second memory array.

5. A semiconductor device according to claim 4, wherein said first switch and said second switch circuits are I switches, and
wherein said plurality of selection lines are I selection lines.

6. A semiconductor device according to claim 4, wherein said first data line and said third data line are connected by a conductive material filled in a first through hole, said first through hole being formed on said first memory array, and
wherein said second data line and said third data line are connected by a conductive material filled in a second through hole, said second through hole being formed on said second memory array.

7. A semiconductor device comprising:
a plurality of memory arrays each including a plurality of memory cells;
a plurality of first signal transmission lines provided one for each of said plurality of memory arrays and extending in a first direction;
a second signal transmission line extending in a second direction perpendicular to said first direction and being provided for said plurality of first signal transmission lines;
a plurality of switch circuits respectively provided for each of said plurality of memory arrays; and
a plurality of selection lines to transmit a plurality of selection signals to said plurality of switch circuits,
wherein each of said plurality of memory arrays includes a plurality of word lines extending in said first direction and a plurality of data lines extending in said second direction,
wherein each of said plurality of switch circuits is connected between a plurality of data lines of a corresponding memory array and a corresponding first signal transmission line, and
wherein said second signal transmission line is formed on said plurality of memory arrays.

8. A semiconductor device according to claim 7, wherein said plurality of switch circuits are I switches, and
wherein a plurality of selection lines are I selection lines.

9. A semiconductor device according to claim 7, wherein each of said plurality of first signal transmission lines and said second signal transmission line are connected by a conductive material filled in a corresponding one of a plurality of through holes, each of said through holes being formed on a corresponding memory array.

10. A semiconductor device comprising:
a first memory array having a plurality of first memory cells;
a second memory array having a plurality of second memory cells;
a first data line provided for said first memory array, said first data line transferring data read out from said plurality of first memory cells;
a second data line provided for said second memory array, said second data line transferring data read out from said plurality of second memory cells; and
a third data line provided for said first and second data lines, said third data line transferring data read out from said plurality of first and second memory cells,
wherein said third data line is formed on said first memory array and said second memory array.

11. A semiconductor device according to claim 10, wherein said first data line is a first local data line, wherein said second data line is a second local data line, and
wherein said third data line is a main data line.

12. A semiconductor device according to claim 10, wherein said first data line and said third data line are connected by a conductive material filled in a first through hole, said first through hole being formed on said first memory array, and
wherein said second data line and said third data line are connected by a conductive material filled in a second through hole, said second through hole being formed on said second memory array.

13. A semiconductor device comprising:
a plurality of memory cells for storing data;
an amplifier circuit for amplifying data read out from said plurality of memory cells; and
a line which transfers data amplified by said amplifier circuit,
wherein said line is formed on at least one of said plurality of memory cells.

14. A semiconductor device comprising:
a plurality of memory cells which store data;
a sense amplifier which amplifies data read out from said plurality of memory cells; and
a data transfer line which transfers data which is amplified by said amplifier circuit,
wherein said data transfer line is formed over at least one of said plurality of memory cells.

15. A semiconductor device comprising:

a plurality of word lines;

a plurality of pairs of bit lines;

a plurality of memory cells which are respectively coupled to said plurality of word lines and said plurality of pairs of bit lines;

an amplifier circuit coupled to said plurality of pairs of bit lines;

a first data transmission line;

a switch circuit coupled between said plurality of pairs of bit lines and said first data transmission line; and a second data transmission line coupled to said first data transmission line, wherein said second data transmission line is formed on at least one of said plurality of memory cells.

16. A semiconductor device according to claim 15, wherein said first data transmission line is a first local data line, and wherein said second data transmission line is a main data line.

17. A semiconductor device comprising:

a first memory array having a plurality of first memory cells;

a second memory array having a plurality of second memory cells;

a first data line formed in a first layer, extending in a first direction and provided for said first memory array;

a second data line formed in said first layer, extending in said first direction and provided for said second memory array;

a third data line formed in a second layer which is different from said first layer and extending in a second direction perpendicular to said first direction, said third data line being provided for said first and second data lines, wherein said third data line is formed on said first memory array and said second memory array;

wherein said first data line and said third data line are connected by a conductive material filled in a first through hole, said first through hole being formed on said first memory array, and wherein said second data line and said third data line are connected by a conductive material filled in a second through hole, said second through hole being formed on said second memory array.

* * * * *